United States Patent [19]

Fujishima et al.

[11] 4,302,694
[45] Nov. 24, 1981

[54] COMPOSITE PIEZOELECTRIC TUNING FORK WITH ECCENTRICLY LOCATED ELECTRODES

[75] Inventors: Satoru Fujishima, Muko; Takeshi Nakamura, Uji, both of Japan

[73] Assignee: Murata Manufacturing Co., Ltd., Japan

[21] Appl. No.: 72,341

[22] Filed: Sep. 5, 1979

[30] Foreign Application Priority Data

Sep. 12, 1978 [JP] Japan .............................. 53-112655

[51] Int. Cl.³ .......................................... H01L 41/08
[52] U.S. Cl. .................................. 310/321; 310/365; 310/370; 29/25.35
[58] Field of Search ............... 310/321, 370, 366, 365; 333/186, 187, 189–191, 200; 58/23 TF; 29/25.35

[56] References Cited

U.S. PATENT DOCUMENTS

| | | | |
|---|---|---|---|
| 2,081,405 | 5/1937 | Mason | 310/370 X |
| 3,128,397 | 4/1964 | Shinada et al. | 333/187 X |
| 3,354,413 | 11/1967 | Ko | 310/321 X |
| 3,361,994 | 1/1968 | Takahashi | 333/200 |
| 3,509,387 | 4/1970 | Thorn | 310/321 |
| 3,634,787 | 1/1972 | Newell | 310/321 X |
| 3,659,230 | 4/1972 | Tanaka | 333/200 |
| 3,683,213 | 8/1972 | Staudte | 310/370 |
| 3,944,862 | 3/1976 | Shimoi et al. | 310/370 X |
| 4,178,526 | 12/1979 | Nakamura et al. | 310/321 |

Primary Examiner—Mark O. Budd

[57] ABSTRACT

A piezoelectric tuning fork device comprises a plate-like tuning vibrator having a pair of prongs and a base with a slot defined between the prongs. The tuning vibrator has at least one electrode layer deposited on and overlying a piezoelectric layer formed on one of the opposed major surfaces of the tuning vibrator. The electrode layer is generally U-shaped and has a pair of opposed leg portions each so positioned as to have its longitudinal axis located to one side of the imaginary corresponding prong.

6 Claims, 6 Drawing Figures

COMPOSITE PIEZOELECTRIC TUNING FORK WITH ECCENTRICLY LOCATED ELECTRODES

BACKGROUND OF THE INVENTION

The present invention generally relates to an electromechanical resonator and, more particularly, to a piezoelectric tuning fork device.

Various types of piezoelectric tuning fork devices have heretofore been available commercially, an example of which is shown in FIG. 1 of the accompanying drawings. Referring to FIG. 1, the prior art piezoelectric tuning fork device comprises a generally U-shaped tuning vibrator 1 formed by bending a strip of metallic material so as to provide a pair of opposed and juxtaposed prongs 2 and 3 which occupy the opposed leg portions of the shape of a Figure "U", respectively. Each of the prongs 2 and 3 has and electrode layer 6 or 7 deposited on and overlying a respective piezoelectric ceramic plate 4 or 5 bonded to either one of the external and internal surfaces, for example, the internal surface, of the corresponding prong 2 or 3.

The prior art piezoelectric tuning fork device described with reference to and shown in FIG. 1 involves some difficulties. Specifically, since the tuning vibrator 1 is formed by bending the metallic strip, there is a limit to the possible reduction in size of the piezoelectric tuning fork device. In addition, the employment of a bonding agent used to connect the piezoelectric ceramic plates 4 and 5 to the respective prongs 2 and 3 tends to adversely affect the performance of the piezoelectric tuning fork device itself to such an extent that the role and importance of the bonding agent cannot be ignored in designing such a device.

In view of the above described difficulties, the present inventors have devised a piezoelectric tuning fork device, such as shown in FIG. 2 of the accompanying drawings and disclosed in the copending United State patent application Ser. No. 902,819. The piezoelectric tuning fork device shown in FIG. 2 comprises a generally U-shaped tuning vibrator 10 formed by cutting a generally rectangular block of metal to provide a pair of opposed and juxtaposed prongs 11 and 12 which occupy the opposed leg portions of the shape of a figure "U", respectively. Each of the prongs 11 and 12 has an electrode layer 13 or 14 vapor-deposited on and overlying a respective piezoelectric layer 15 or 16 which is made of a piezoelectric material such as ZnO and which is deposited on an external surface of the corresponding prong 11 or 12 by the use of a known sputtering technique.

The piezoelectric tuning fork device described with reference to and shown in FIG. 2 can be manufactured in a size more compact than that shown in FIG. 1 and, as compared with the construction shown in FIG. 1, can be manufactured precisely on a mass production line, is simple in design and has relatively high physical strength.

SUMMARY OF THE INVENTION

The present invention has been developed for the purpose of enhancing the advantages of the piezoelectric tuning fork device of the construction shown in FIG. 2 and has for its essential object to provide an improved piezoelectric tuning fork device which can be manufactured in a size more compact than that shown in FIG. 2.

Another important object of the present invention is to provide an improved piezoelectric tuning fork device of the type referred to above, which is manufactured on a mass production line more readily than that shown in FIG. 2.

A further object of the present invention is to provide an improved piezoelectric tuning fork device of the type referred to above, which can be manufactured precisely in dimension.

A still further object of the present invention is to provide an improved piezoelectric tuning fork device of the type referred to above, which is simpler in structure than that shown in FIG. 2.

A still further object of the present invention is to provide an improved piezoelectric tuning fork device of the type referred to above, which has greater physical strength than that shown in FIG. 2.

It is a related object of the present invention to provide a method for manufacturing the improved piezoelectric tuning fork device of the type referred to above.

In order to accomplish these objects, the present invention provides an improved piezoelectric tuning fork device which comprises a plate-like tuning vibrator formed by shaping a plate of electroconductive material to provide a pair of opposed and juxtaposed prongs and a base with a substantially elongated blank defined between the prongs. The base extends in a direction at right angles to the longitudinal axis of any one of the prongs and has its opposed ends integral with the respective prongs. The tuning vibrator has at least one electrode layer deposited on and overlying a piezoelectric layer formed on at least one of the opposed surfaces of the tuning vibrator by the use of any known gas-phase plating method, including physical vapor deposition methods, such as metal vapor bonding, sputtering or ion plating, and chemical vapor deposition methods. The electrode layer is generally U-shaped and has a pair of opposed leg portions each so positioned as to have its longitudinal axis located to one side of the imaginary center line of the corresponding prong and parallel to the longitudinal axis of such corresponding prong.

The piezoelectric layer may be made of any known piezoelectric material such as ZnO, while the electrode layer may be deposited on the piezoelectric layer by the use of any known electrode forming method such as a metal vapor depositing method.

The piezoelectric tuning fork device according to the present invention may have an additional electrode layer which may be positioned on either the surface of the tuning vibrator where the first mentioned electrode layer is positioned or the opposite surface of the tuning fork vibrator.

BRIEF DESCRIPTION OF THE DRAWINGS

These and other objects and features of the present invention will become apparent from the following description taken in conjunction with preferred embodiments thereof with reference to the accompanying drawings, in which.

DETAILED DESCRIPTION OF THE INVENTION

Figure 1:
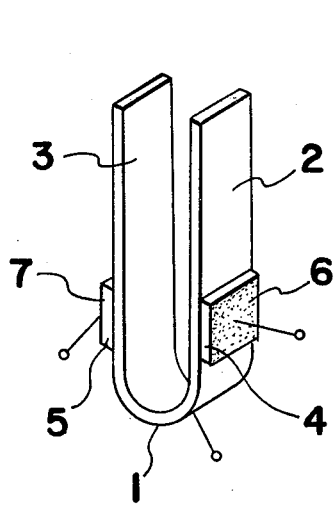
FIG. 1 is a perspective view of the prior art piezoelectric tuning fork device.
Figure 2:
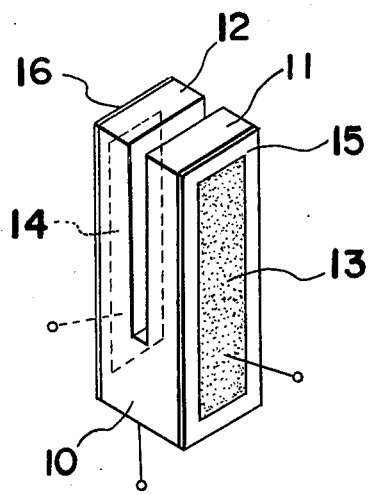
FIG. 2 is a view similar to FIG. 1, showing another prior art piezoelectric tuning fork device.

Before the description of the present invention proceeds, it is to be noted that like parts are designated by like reference numerals throughout FIGS. 3 to 6.

Figure 3:
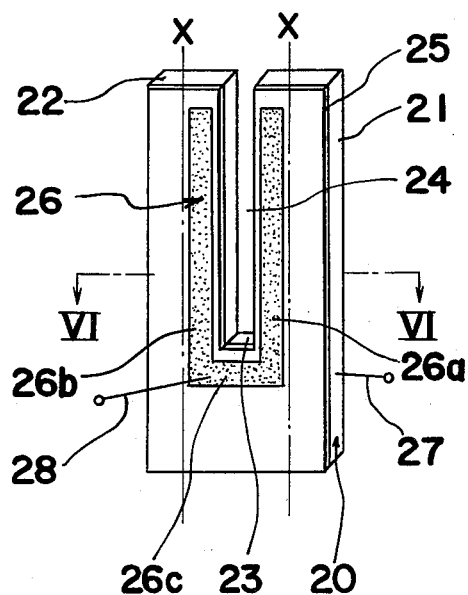
FIGS. 3 to 5 are perspective views of an improved piezoelectric tuning device according to different embodiments of the present invention.

Referring now to FIG. 3, a piezoelectric tuning fork device embodying the present invention comprises a plate-like tuning vibrator 20 having a pair of opposed and juxtaposed prongs 21 and 22 and a base 23 extending at right angles to the longitudinal axes of the prongs 21 and 22 and having its opposed ends integral with the respective prongs 21 and 22. The tuning vibrator 20 can be formed by either punching or photoetching a portion of a substantially rectangular plate of electroconductive material off from the plate to define a substantially elongated slot 24 which extends from one end of the substantially rectangular plate to a position inwardly adjacent the opposite end of the same rectangular plate, thereby leaving the prongs 21 and 22 on respective sides of the slot 24. The tuning vibrator 20 may be made of any known electroconductive metallic material, but a non-expansion FeNi alloy, that is, a metallic alloy having a low coefficient of thermal expansion and a constant elasticity, such as that generally known as "elinvar," is preferred.

So far shown in FIG. 3, the tuning vibrator 20 has a piezoelectric layer 25 of any known piezoelectric ceramic such as ZnO overlaying one of the opposed surfaces of the tuning vibrator 20. Formation of the piezoelectric layer 25 on the surface of the tuning vibrator 20 can be carried out by the use of any known gas-phase plating process, including physical vapor deposition methods, such as metal vapor deposition, sputtering or ion plating, and chemical vapor deposition methods.

The piezoelectric tuning fork device further comprises a generally U-shaped electrode layer 26 having a pair of juxtaposed long sections 26a and 26b and a short section 26c, said short section having its opposed ends integral with and connecting the long sections 26a and 26b together to render the elements 26a, 26b and 26c to assume a substantially U-shaped configuration. Although the electrode layer 26 may be deposited on the piezoelectric layer 25 by the utilization of any known electrode forming method, preferably by the utilization of a metal vapor depositing method, the electrode layer 26 is formed on the piezoelectric layer 25 in such a manner as to render the longitudinal axis of each of the long sections 26a and 26b of the electrode layer 26 to be displaced inward from and parallel to the imaginary center line X of the corresponding prong 21 or 22.

Electrically connected to the tuning vibrator 20 and the electrode layer 26 are respective lead wires 27 and 28 for external electric connection.

In operation, assuming that an electric input signal is applied to the tuning vibrator 20 through the lead wire 27, the tuning vibrator 20 vibrates at a particular frequency in a plane parallel to the plane of the electrode layer 26 with the prongs 21 and 22 cyclically moving close towards and away from each other and an output can be obtained from the electrode layer 26 by way of the lead wire 28.

In the foregoing embodiment shown in FIG. 3, the long sections 26a and 26b of the electrode layer 26 have been described as extending along side portions of the respective prongs 21 and 22 adjacent the slot 24. However, in the embodiment shown in FIG. 4, a generally U-shaped electrode layer 29 having a pair of juxtaposed long sections 29a and 29b and a short section 29c all arranged to assume a substantially U-shaped configuration, which electrode layer 29 corresponds in function to the electrode layer 26 shown in FIG. 3, is formed on the piezoelectric layer 25 with the longitudinal axis of each of the long sections 29a and 29b of the electrode layer 29 displaced outward from and parallel to the corresponding center line X.

Figure 4:
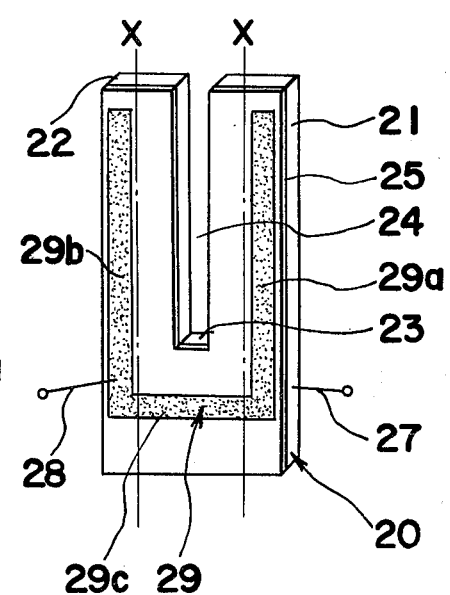

The piezoelectric tuning fork device of the construction shown in FIG. 4 can operate satisfactorily in a manner similar to that shown in FIG. 3.

Figure 5:
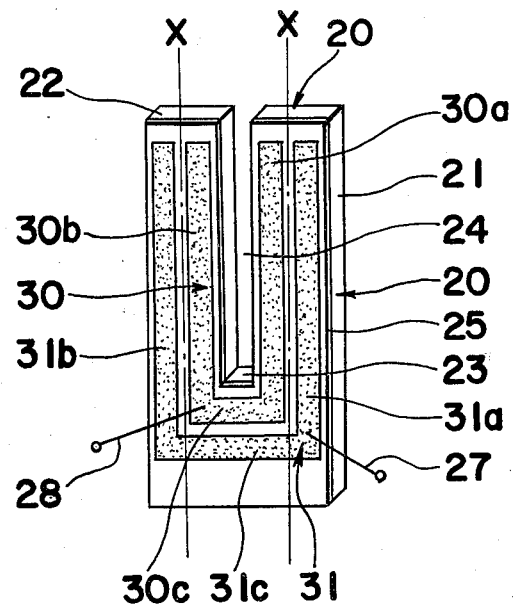

In the embodiment shown in FIG. 5, there is employed a pair of electrode layers 30 and 31 both deposited on the piezoelectric layer 25. While each of the inner and outer electrode layers 30 and 31 has a pair of juxtaposed long sections 30a and 31a and 30b or 31b and a short section 30c or 31c all arranged to assume a substantially U-shaped configuration, the electrode layers 30 and 31 are positioned, respectively, similarly to the electrode layers 26 and 29 shown in FIGS. 3 and 4. In other words, each of the long sections 30a and 30b of the electrode layer 30 extends along one side portion of the corresponding prong 21 or 22 adjacent the slot 24 and on one side of the corresponding center line X adjacent the slot 24 while each of the long sections 31a and 31b of the electrode layer 31 extends along the corresponding prong 21 or 22 on the other side of the corresponding center line X and remote from the slot 24.

In the arrangement shown in FIG. 5, the lead wires 27 and 28 are electrically connected to the electrode layers 30 and 31.

The piezoelectric tuning fork device of the construction shown in FIG. 5 can operate in a manner similar to the bimorph type vibrator and, therefore, can give a relatively high electro-mechanical signal conversion efficiency as compared with that given by the piezoelectric tuning fork device of the construction shown in any one of FIGS. 3 and 4.

Figure 6:
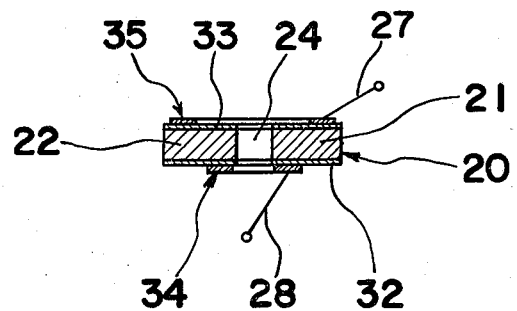
FIG. 6 is a cross sectional view, taken along the line VI—VI in FIG. 3, showing a further embodiment of the present invention.

In the embodiment shown in FIG. 6, the tuning vibrator 20 has its opposed surfaces overlaid with respective piezoelectric layers 32 and 33, each being of a generally U-shaped configuration, and includes first and second electrode layers 34 and 35. The first electrode layer 34 is positioned on the piezoelectric layer 32 in a manner similar to the electrode layer 30 shown in FIG. 5, whereas the second electrode layer 35 is positioned on the piezoelectric layer 33 in a manner similar to the electrode layer 31 shown in FIG. 5.

Formation of each of the piezoelectric layer 32 and 33 on the respective surfaces of the tuning vibrator 20 is carried out by the use of the gas-phase plating process which has hereinbefore been described.

The piezoelectric tuning fork device of the construction shown in FIG. 6 can operate in a manner similar to that shown in FIG. 5.

It is to be noted that, in the embodiment shown in FIG. 5, the long portions 30a and 31a, and similarly the long portions 30a and 30b, should be located on respective sides of the corresponding center line X and equally spaced therefrom. The same applies equally to the electrodes 34 and 35 shown in FIG. 6.

The piezoelectric tuning fork device of the construction shown in any one of FIGS. 3 to 6 and according to the present invention is, in practice, supported in any known manner, preferably either by the use of a support rod (not shown) connected to the device at a position corresponding to a node of vibration of the vibrator 20 or by the use of a stem (not shown) welded, or otherwise connected, to the base 25 of the vibrator 20.

Although the present invention has fully been described in connection with the preferred embodiments thereof with reference to the accompanying drawings, it is to be noted that various changes and modifications apparent to those skilled in the art are to be construed as included within the true scope of the present invention.

What is claimed is:

1. A piezoelectric tuning fork, comprising:
   a generally planar vibrator means made of an electrically conductive non-piezoelectric material, said vibrator means having two opposed major surfaces and having two prongs and a base portion, said prongs extending from said base portion in generally the same direction and defining a gap between them, and each of said prongs being divided by an imaginary longitudinal center line into an inner and an outer side, said inner side of each prong being adjacent to said gap and said outer side of each prong being remote from said gap;
   a first piezoelectric layer disposed on one of said opposed major surfaces and covering said one major surface substantially completely;
   a first U-shaped electrode layer disposed on said first piezoelectric layer and having two arm portions and a central portion, each of said arm portions overlying a respective one of said prongs, each of said arm portions being substantially on one side of said center line of its respective prong, and said arm portions being about equally remote from said gap in a direction perpendicular to said direction in which said prongs and said gap extend, said first electrode layer being the only electrode layer disposed on said piezoelectric layer; and
   said tuning fork having a first terminal connected to said first electrode, and having a second terminal connected to said tuning fork at such a location that an electrical signal applied to either of said terminals must pass through said first electrode, said first piezoelectric layer, and said vibrator means to reach the other said terminal.

2. The tuning fork of claim 1, wherein said arm portions are located substantially on said inner side of their respective prongs.

3. The tuning fork of claim 1, wherein said arm portions are located substantially on said outer side of their respective prongs.

4. The tuning fork of claim 2, further comprising a second piezoelectric layer disposed on the other of said opposed major surfaces of said vibrator means, and further comprising a second U-shaped electrode layer disposed on said second piezoelectric layer and having two arm portions respectively overlying said prongs, said arm portions of said second electrode layer being located substantially on said outer side of their respective prongs.

5. A method for manufacturing a piezoelectric tuning fork, comprising the steps of:
   forming a generally planar, U-shaped vibrator means having two opposed major surfaces and having two prongs and a base portion, said prongs extending generally in the same direction from said base portion and defining between them a gap; each of said prongs being divided by an imaginary longitudinal center line into an inner side adjacent said gap and an outer side remote from said gap; said vibrator means being formed of an electrically conductive, non-piezoelectric material;
   forming a first piezoelectric layer substantially completely covering said opposed major surfaces; and
   forming a first electrode layer, and no other electrode layer, on said piezoelectric layer, said first electrode layer having first and second arm portions overlying respective ones of said prongs, each of said arm portions being substantially on one side of said center line of its respective prong, and said arm portions being about equally remote from said gap.

6. The method of claim 5, wherein said piezoelectric layer is formed by means of a gas-phase plating process.

* * * * *